United States Patent [19]

Crawford

[11] 4,055,841
[45] Oct. 25, 1977

[54] OPTICAL GRAY TO BINARY CODE CONVERTER

[75] Inventor: Charles David Crawford, Burlington, N.C.

[73] Assignee: Bell Telephone Laboratories, Incorporated, Murray Hill, N.J.

[21] Appl. No.: 665,332

[22] Filed: Mar. 9, 1976

[51] Int. Cl.² .......................................... H03K 13/24
[52] U.S. Cl. ........................................... 340/347 DD
[58] Field of Search ................... 340/347 DD, 347 M; 285/154, 155; 307/216

[56] References Cited

U.S. PATENT DOCUMENTS

| 2,762,564 | 9/1956 | Samson | 340/347 DD |
| 3,122,734 | 2/1964 | Rice | 340/347 DD |
| 3,157,792 | 11/1964 | Low | 307/216 |

OTHER PUBLICATIONS

Lippel, "Proc. of the Natl. Elect. Conf.", V8 Sept. 1952, pp. 636-646.

Primary Examiner—Charles D. Miller
Attorney, Agent, or Firm—Thomas Stafford

[57] ABSTRACT

Signals representative of information bits are converted from one binary code, for example, Gray code, to another binary code, for example, conventional binary, and vice versa, by advantageously employing optical couplers in conjunction with buffer amplifiers. The optical couplers include light emitting diodes and associated phototransistors which are uniquely connected in circuit relationship with the outputs of the buffer amplifiers to effect the desired code conversions.

11 Claims, 4 Drawing Figures

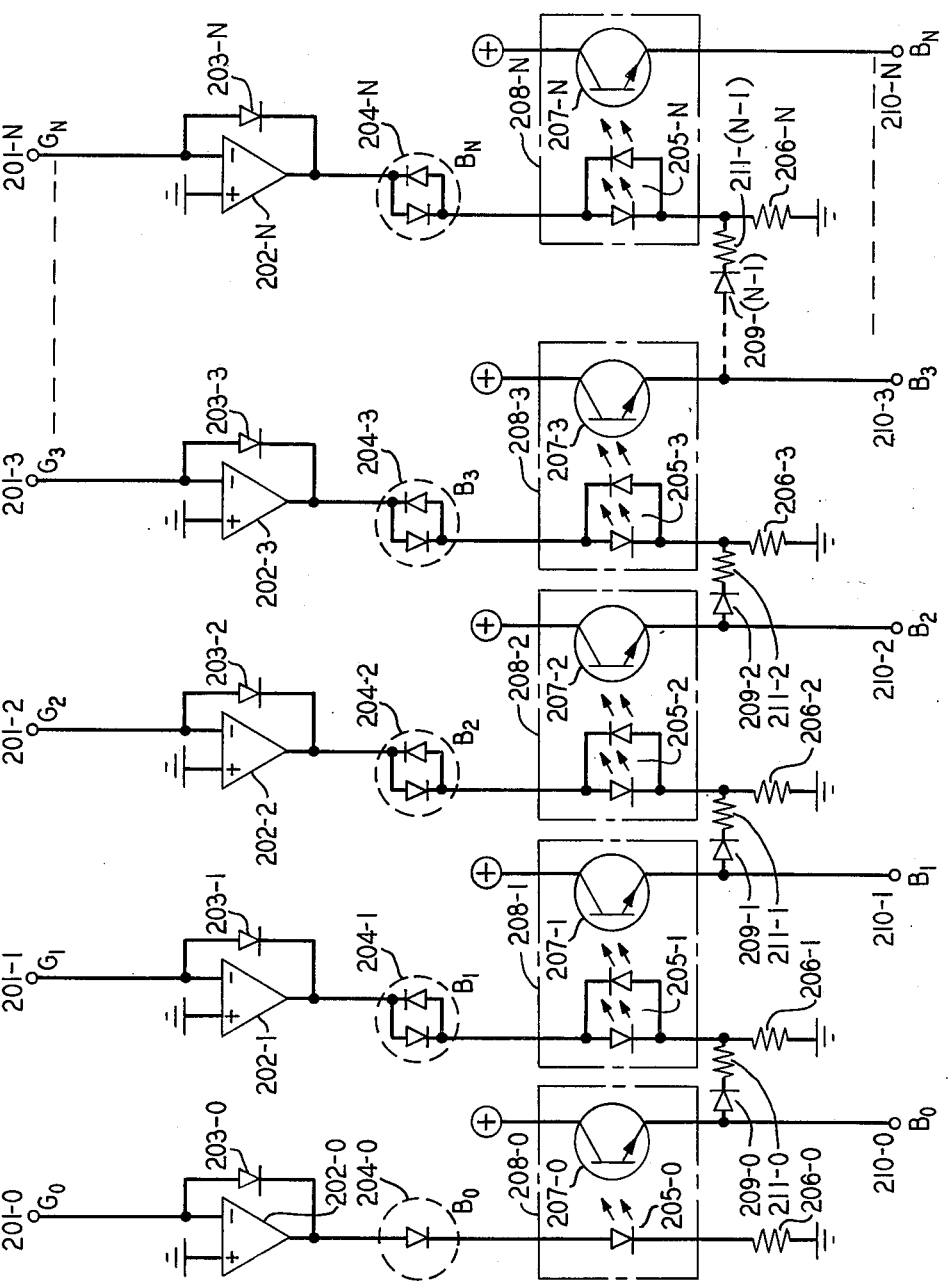

OPTICAL GRAY TO BINARY CODE CONVERTER

BACKGROUND OF THE INVENTION

This invention relates to code translation and, more particularly, to the translation of signals from a first binary code to a second binary code and vice versa.

Binary code representation of information signals is now well known in the art. Two codes which have experienced widespread use are the so-called conventional binary code, now commonly referred to as binary code, and the reflected binary code, now commonly referred to as Gray code.

Uses and advantages of both the binary and Gray codes are well known and it has become common to convert or translate between these codes in order to realize efficiencies in communications systems. The conversion of signals from the Gray (G) code to binary (B) code is expressed $$B_0 = G_0 \quad (1)$$

and $$B_N = G_N \oplus B_{N-1} \text{ for } N \geq 1, \quad (2)$$

where 0 represents the most significant bit and as N increases the bit is less significant, and the conversion of signals from the binary code to the Gray code is expressed $$G_0 = B_0 \quad (3)$$

and $$G_N = B_N \oplus B_{N-1} \text{ for } N \geq 1, \quad (4)$$

where 0 is the most significant bit and as $N$ increases the bit is less significant.

FIG. 1 shows a table illustrating the relationship between binary code, Gray code and the corresponding decimal number. It will be apparent from the tabulation shown in FIG. 1 how any number may be determined in either the binary code or the Gray code.

A number of arrangements have been developed for translating signals from one code to the other. In light of the Exclusive OR functional relationship between the codes, as indicated in Equations 1 through 4, it has become common practice to employ digital logic circuit arragements including Exclusive OR gates to implement the desired translation functions. In certain applications, however, it is undesirable to employ such digital logic circuits because they are fairly complex and usually require the use of precise bias potentials and levels other than those readily available. This is especially true in equipment which primarily employs analog circuit elements, for example, differential amplifiers and the like. Since use of digital logic circuits usually requires additional power supplies, such use is undesirable from both an economic standpoint and a space usage standpoint.

SUMMARY OF THE INVENTION

These and other problems are resolved in accordance with the inventive principles to be described herein in relation to code translators for converting from a first binary code to a second binary code and vice versa.

In accordance with one aspect of the invention, signals representing information bits in a first binary code, for example, Gray code, are translated into information bits in a second binary code, for example, conventional binary, and vice versa, by advantageously employing optical couplers.

In one embodiment, Gray code to binary code translation is realized by employing optical couplers each of which includes a radiant energy emitting element and an asociated radiant energy responsive element. Specifically, the radiant energy emitting elements are associated on a one-to-one basis with a plurality of inputs arranged for supplying signals representative of information bits in the Gray code which are ordered from a most significant bit to a least significant bit. The radiant energy responsive elements are connected on a one-to-one basis in predetermined circuit relationship with the radiant energy emitting element associated with the next less significant input and are individually responsive to radiant energy from their associated radiant energy emitting element for controllably supplying a potential to the radiant energy emitting element associated with the next less significant input. Then, the conductive states of the individual radiant energy emitting elements are indicative of the information bits in the binary code. For example, the radiant energy emitting elements which are conducting and, therefore, emitting radiant energy, represent logical 1s while the radiant energy emitting elements which are not conducting and, therefore, not emitting radiant energy, represent logical 0s. In one example, the radiant energy elements are light emitting diodes and the radiant energy responsive elements are phototransistors. Additionally, the light emitting diodes associated with all inputs except the most significant input are arranged to respond to bidirectional current flow.

In another embodiment, binary to Gray code translation is achieved by employing a plurality of radiant energy emitting elements in predetermined circuit relationship with a plurality of inputs arranged for supplying signals representative of information bits in the conventional binary code which are ordered from a most significant bit to a least significant bit. One of the radiant energy emitting elements is connected in circuit relationship between the most significant bit input and a reference potential while the remaining ones of the radiant energy emitting elements are connected on a one-to-one basis in predetermined circuit relationship between a corresponding one of the inputs and the next less significant bit input in sequential order from the most significant bit input to the least significant bit input. Simply stated, the radiant energy emitting elements are connected in serial circuit relationship between the least significant bit input and the reference potential and the remaining inputs are connected to circuit points between adjacent ones of the radiant energy emitting elements. Then, potentials developed at, or otherwise supplied to, the inputs in binary code determine the conductive states of the radiant energy emitting elements which, in turn, are indicative of information bits in the Gray code. All of the radiant energy emitting elements, except the one indicative of the most significant Gray code bit, are arranged to respond to bidirectional current flow. In one example, radiant energy responsive elements are associated on a one-to-one basis with the radiant energy emitting elements for generating signals representative of information bits in the Gray code.

BRIEF DESCRIPTION OF THE DRAWINGS

These and other objects and advantages of the invention will be more fully understood in the following detailed description of embodiments of the invention taken in connection with the appended drawings in which:

FIG. 1 is a tabulation illustrating the relationship between signals in Gray code, binary code and the corresponding decimal number;

FIG. 2 shows a translator for converting Gray code signals to conventional binary code signals;

DETAILED DESCRIPTION

Figure 3:
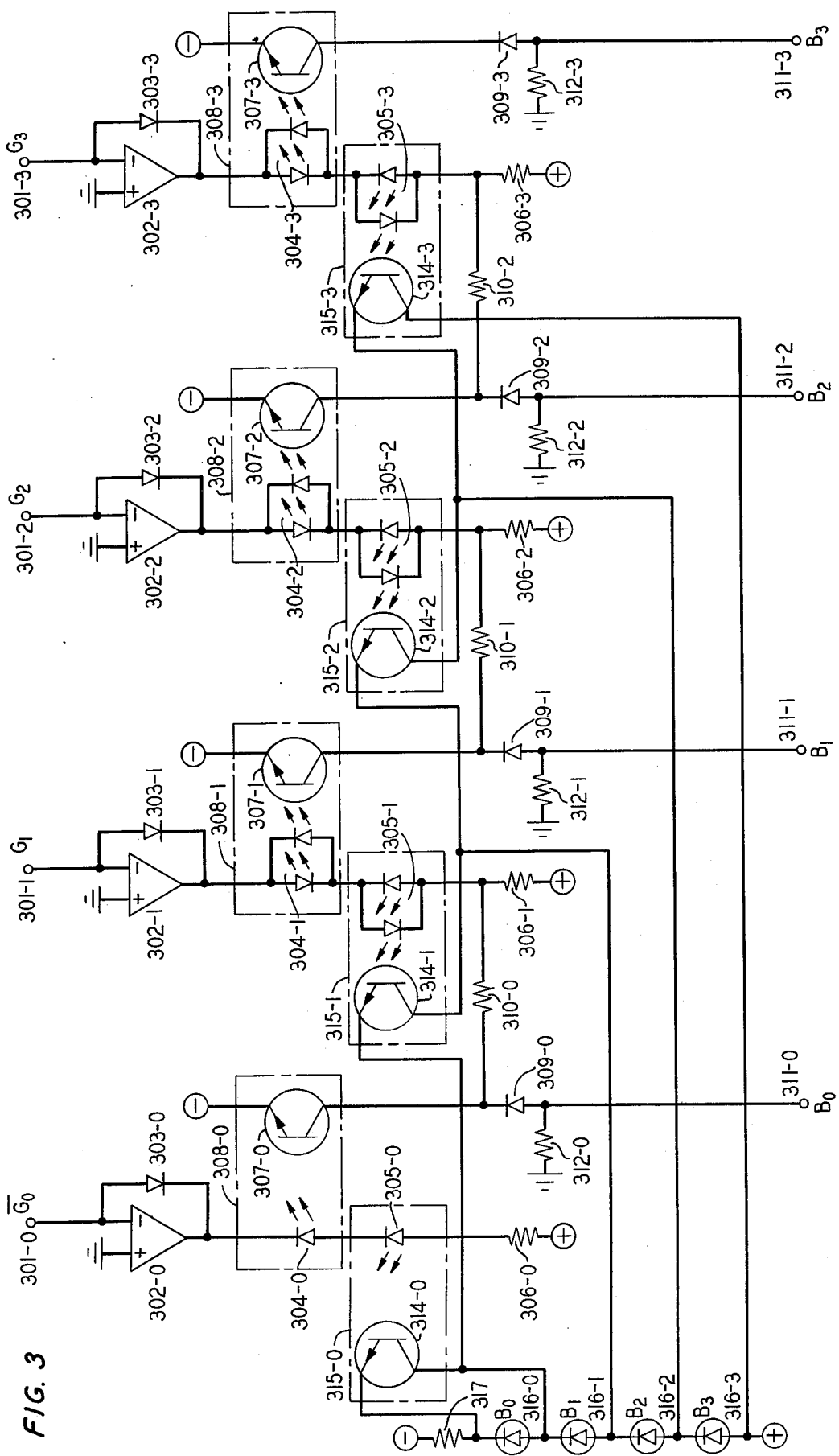
FIG. 3 depicts another translator for converting from Gray code to conventional binary code.

FIG. 2 depicts one embodiment of the translator in accordance with the invention for converting from Gray code to conventional binary code. Accordingly, signals representing information bits, for example a number, in the Gray code which are ordered from most significant to least significant, namely $G_O$ through $G_N$, are simultaneously supplied to inputs 201-0 to 201-N of buffer amplifiers 202-0 through 202-N, respectively. The input signals must be supplied for an interval of sufficient duration to allow the translation to be completed. The response times of the devices used in implementing the translator will determine this interval. In this example, amplifiers 202-0 through 202-N are of the high gain differential type now commonly known as operational amplifiers. Diodes 203-0 through 203-N are connected in feedback circuit paths between an inverting input and an output of amplifiers 202-0 through 202-N, respectively. Noninverting inputs of amplifiers 202-0 through 202-N are connected to a reference potential point, for example, ground potential. Diodes 203 are employed in well-known fashion to limit the output from amplifiers 202 to a single polarity. Additionally, it is important to note that the output impedance of amplifiers 202, configured as shown in FIG. 2, is substantially zero ohms, being the open loop output impedance of the individual amplifiers divided by the open loop gain, as is well known. Amplifiers 202 each yield substantially zero output potential when signals applied to inputs 201 are representative of logical 0s, for example, zero input potential or a positive input potential, and yield a predetermined positive potential, for example +6 volts, when signals applied to inputs 201 are representative of logical 1s, for example a negative potential. Thus when Gray code inputs $G_O$ through $G_N$ are logical 1s the outputs from amplifiers 202 are +6 volts and when the Gray code inputs are logical 0s the outputs from amplifiers 202 are substantially 0 volts at substantially ground potential.

Output signals from amplifiers 202-0 through 202-N are supplied to radiant energy emitting elements 204-O through 204-N, respectively. Elements 204-0 through 204-N yield a visual indication of the desired binary code outputs $B_O$ through $B_N$, respectively, as will be explained below. In this example, elements 204-0 through 204-N include light emitting diodes (LEDs). Element 204-0 includes a single LED while each of elements 204-1 through 204-N include first and second LEDs connected in parallel and oppositely poled for responding to bidirectional current flow for emitting radiant energy. Reasons for this bidirectional responsive element will become apparent upon considering the circuit operation discussed below. In some applications elements 204-0 through 204-N may be eliminated, for example, in those applications in which a visual indication of binary outputs $B_O$ through $B_N$ is not required.

Elements 204-0 through 204-N are connected in series with radiant energy emitting elements 205-0 through 205-N which, in turn, are connected in series with current limiting resistors 206-0 through 206-N, respectively. Each of resistors 206 is connected to a reference potential, in this example ground potential. Elements 205 also include LEDs with element 205-0 including a single LED while elements 105-1 throgh 205-N each include first and second LEDs connected in parallel and oppositely poled for responding to bidirectional current flow for emitting radiant energy, i.e., light.

Radiant energy responsive elements, in this example phototransistors 207-0 through 207-N, are associated on a one-to-one basis with and arranged in predetermined spatial relationship with radiant energy emitting elements 205-0 through 205-N to form optical couplers 208-0 through 208-N, respectively. Phototransistors 207-0 through 207-(N−1) (not shown) are connected between a source of potential, in this example +12 volts, diodes 209-0 through 209-(N−1) and output terminals 210-0 through 210-(N−1) (not shown), respectively. Phototransistor 207-N is connected between the +12 volt potential source and output terminal 210-N. In applications that electrical outputs are not required, phototransistor 207-N may be eliminated. Diodes 209-0 through 209-(N−1) are connected in series with resistors 211-0 through 211-(N−1), respectively, and are employed to pass positive potential from phototransistors 207-0 through 207-(N−1) while blocking current flow or potential from LEDs 205-1 through 205-N, respectively. Diodes 209-0 through 209-(N−1) may be eliminated in applications that do not require signals to be developed at terminals 210-0 through 210-N. Resistors 211-0 through 211-(N-1) in conjunction with resistors 206-1 through 206-N, respectively, form voltage dividers for developing a predetermined potential at circuit points between the respective resistors when associated ones of phototransistors 207 are conducting, i.e., ON. Neglecting for the moment LEDs 205, the potential developed at the junction between resistors 211 and 206 when phototransistors 207 are ON is, in this example, approximately +6 volts.

The Gray to binary code translator shown in FIG. 2 operates to effect a desired code conversion as expressed in Equations 1 and 2. As indicated in Equation 1, $B_O = G_O$. Accordingly, this function is effected by amplifier 202-0 and LEDs 204-0 and 205-0. Since the output of amplifier 202-0 is +6 volts when $G_O$ is a logical 1, LEDs 204-0 and 205-0 respond to that output to conduct current and, therefore, emit radiant energy indicating that binary bit $B_O$ is a logical 1. When $G_O$ is a logical 0 the output from amplifier 202-0 is 0 volts and LEDs 204-0 and 205-0 are nonconducting and, therefore, do not emit radiant energy indicating that binary bit $B_O$ is a logical 0. Phototransistor 207-0, in conjunction with associated LED 205-0, is operative to effect the so-called binary carry function of Equation 2, namely $B_{N-1}$. That is to say, binary bit $B_{N-1}$ represented by the conductive state of LED 205-(N−1) is carried or supplied via phototransistor 207-(N-1) to LED 205-N associated with the next less significant bit input, where the binary bit is Exclusively ORed with Gray code bit $G_N$ supplied to input N for N ≧ 1. Thus, the desired carry function $B_{N-1}$ is realized by the LED associated with the next more significant bit input controlling the conductive state of its associated phototransistor. Accordingly, when photo-transistor 207-0 is turned ON in response to light emitted by LED 205-0, binary bit $B_O$ is a logical 1 and approximately +6 volts is supplied to the circuit junction between resistors 211-0 and 206-1. When phototransistor 207-0 is OFF binary bit $B_O$ is a logical 0 and no potential is supplied via phototransistor 207-0 to the junction between resistors 211-0 and 206-1. The operative states of LEDs 204-1 and 205-1 depend upon Gray code input $G_1$ and binary carry bit $B_O$. That is, LEDs 204-1 if used, and 205-1 effect the desired Exclusive OR function of Equation 2 for N = 1.

When $G_1 = 0$ and $B_O = 0$ the output from amplifier 202-1 is approximately zero volts and the potential developed at the junction between resistors 211-0 and 206-1 is also approximately 0 volts. Consequently, LEDs 204-1 and 205-1 do not conduct indicating $B_1$ is a logical 0. Similarly, when $G_1 = 1$ and $B_0 = 1$ the output from amplifier 202-1 is +6 volts and a potential of approximately +6 volts is developed via phototransistor 207-0 at the junction of resistors 211-0 and 206-1. Therefore, LEDs 204-1 and 205-1 again do not conduct, indicating that $B_1$ is a logical 0. It should be noted that a potential of approximately 2 volts is required before the LEDs emit light. Thus, a difference in potential of approximately 4 volts between the output of amplifiers 202 and the circuit junction between resistors 211 and 206 is required before the LEDs will emit light. This insures against erroneous emission of light since a so-called "hard" on condition is required. When $G_1 = 1$ and $B_0 = 0$ amplifier 202-1 yields +6 volts at its output while phototransistor 207-0 is OFF. Consequently, ones of LEDs 204-1 and 205-1 poled to conduct current in a direction from the output of amplifier 202-1 to ground potential conduct and, therefore, emit light energy indicating $B_1$ is a logical 1. Since one of LEDs 205-1 is emitting radiant energy phototransistor 207-1 is turned ON thereby supplying a potential to the next less significant stage of the converter indicating that $B_1$ is a logical 1. Similarly, when $G_1 = 0$ and $B_O = 1$ amplifier 202-1 yields substantially zero volts at its output while phototransistor 207-0 is ON thereby supplying potential to develop approximately +6 volts at the junction between resistors 211-0 and 206-1. Since the output impedance of amplifier 202-1 is substantially 0 ohms, i.e., essentially ground potential, ones of LEDs 205-1 and 204-1 poled to conduct current in a direction from the junction of resistors 211-0 and 206-1 to the output of amplifier 202-1 conduct and, therefore, emit radiant energy indicating that $B_1$ is a logical 1. Here again phototransistor 207-1 responds to the light emitted from the conducting one of LEDs 205-1 to supply potential to the next less significant stage indicating that $B_1$ is a logical 1. This procedure is iterated for each of the remaining lesser significant stages of the translator, except that the phototransistor associated with the least significant stage, namely phototransistor 207-N, need not perform the carry function and is employed to yield an electrical indication of the state of binary bit $B_N$.

Let us now consider an example of converting a 4-bit Gray code signal to a 4-bit binary code signal. Assuming that $G_0$ through $G_3 = 1101$, then amplifiers 202-0, 202-1 and 202-3 yield +6 volts at their outputs while amplifier 202-2 yields zero volts at its output. LEDs 204-0 and 205-0 conduct thereby emitting light indicating $B_0 = 1$ and phototransistor 207-0 is turned ON causing +6 volts to be developed at the junction between resistors 211-0 and 206-1. Since the output from amplifier 202-1 is +6 volts, LEDs 204-1 and 205-1 do not conduct indicating that $B_1 = 0$. Therefore, phototransistor 207-1 is OFF and no potential is supplied to the junction between resistors 211-1 and 206-2. Since the output from amplifier 202-2 is zero potential, LEDs 204-2 and 205-2 do not conduct thereby indicating that $B_2 = 0$. Therefore, phototransistor 207-2 is also OFF and no potential is supplied to the junction between resistors 211-2 and 206-3. Since the output from amplifier 202-3 is +6 volts ones of LEDs 204-3 and 205-3 poled to conduct current in a direction from the output of amplifier 202-3 to ground potential conduct and, therefore, emit radiant energy indicating that $B_3 = 1$. Phototransistor 207-3 responds to radiant energy emitted from LED 205-3 to supply a positive potential to output 210-3. Thus, LEDs 204-0 through 204-3 yield a visual indication of the desired binary code output, namely $B_0$, $B_1$, $B_2$, $B_3 = 1001$, while output terminals 210-0 through 210-3 yield potentials representing the binary output, specifically, +12 volts at terminals 210-0 and 210-3 and zero volts at terminals 210-1 and 210-2.

In summary, it is seen that the LEDs associated with the most significant Gray code bit input respond to that input to yield an indication of the logical state of the most significant binary bit as defined in Equation 1. The phototransistor associated with the LEDs in circuit with each Gray code bit input, except the least significant bit input, are operative to effect the binary carry function of supplying binary bit $B_{N-1}$ to the LED associated with the next less significant bit input N wherein the LEDs are operative to effect the desired Exclusive OR function defined by Equation 2. Consequently, the Gray to binary code conversion is realized in a relatively simple circuit by advantageously employing optical couplers in conjunction with buffer amplifiers.

FIG. 3 shows another embodiment illustrating the invention for translating signals representative of a number in Gray code to signals representative of the number in conventional binary code. For simplicity and clarity of description only stages for converting a 4-bit number are shown although it will be apparent how to expand the subject translator for converting any number of bits from one code to the other. Additionally, it is noted that all the stages of the subject translator, except the most significant stage, are substantially identical from both physical and functional standpoints.

Accordingly, signals representative of information bits in Gray code, namely $\overline{G}_0$ through $G_3$, are simultaneously supplied to inputs 301-0 through 301-3 of buffer amplifiers 302-0 through 302-3, respectively, for an interval of sufficient duration to complete the desired translation. This duration depends on the operative speeds of the devices used in the translator. Amplifiers 302 are also of the so-called operational type now well-known in the art. Diodes 303-0 through 303-3 are connected between the inverting input and output of amplifiers 302-0 through 302-3, respectively, and are operative to limit the outputs of amplifiers 302 to either 0 volts or a positive potential, in this example +12 volts. Noninverting inputs of amplifiers 302 are connected to a reference potential, in this example ground potential. Outputs of amplifiers 302-0 through 302-3 are connected in circuit with the serial arrangement of LED 304-0, LED 305-0 and current limiting resistor 306-0 through the serial arrangement of LEDs 304-3, LEDs 305-3 and current limiting resistor 306-3, respectively.

Resistors 306-0 through 306-3 are connected to a source of potential, in this example +12 volts. LEDs 304-1 through 304-3 and LEDs 305-1 through 305-3 each include two LEDs connected in parallel and oppositely poled for responding to bidirectional current flow for emitting radiant energy, i.e., light. LEDs 304-0 through 304-3 are associated with and in predetermined spatial relationship with phototransistors 307-0 through 307-3 forming optical couplers 308-0 through 308-3, respectively. Similarly, LEDs 305-0 through 305-3 are associated with and in predetermined spatial relationship with phototransistors 314-0 through 314-3 forming optical couplers 315-0 through 315-3, respectively.

Phototransistors 307 perform the binary carry function $B_{N-1}$ of Equation 2. Phototransistors 307-0 through 307-2 are operative controllably to supply a predetermined potential, in this example −12 volts, to diodes 309-0 through 309-2 and resistors 310-0 through 310-2, respectively. Phototransistor 307-3 is operative to supply −12 volts to diode 309-3. Diodes 309-0 through 309-3 are poled to pass only negative potential and are connected to output terminals 311-0 through 311-3 and bias resistors 312-0 through 312-3, respectively. Signals developed at output terminals 311-0 through 311-3 in response to the operative states of phototransistors 307-0 through 307-3 are representative of binary outputs $B_0$ through $B_3$, respectively, and may be used to control other electronic devices, for example junction field effect transistors or the like. In this example, a negative potential developed at outputs 311-0 through 311-3 represents a logical 0 while zero potential represents a logical 1.

Resistors 310-0 through 310-2, in conjunction with resistors 306-1 through 306-3, respectively, are employed to develop a predetermined potential at the circuit points between the respective ones of the resistors when corresponding ones of phototransistors 307 are ON. The negative potential supplied via conducting ones of phototransistors 307 represents that associated ones of LEDs 304 are conducting and that corresponding ones of binary bits $B_0$ through $B_3$ are logical 0s. When ones of phototransistors 307 are OFF associated ones of LEDs 304 are not conducting and the corresponding binary bits are logical 1s. Thus, in this embodiment of the invention, the binary carry function of Equation 2 is realized by supplying a negative potential to the next less significant stage representing that the corresponding binary bit is a logical 0 and by not supplying a potential to the next less significant stage when the corresponding binary bit is a logical 1. The LEDs of the next less significant stage in conjunction with the output from the corresponding buffer amplifier effect the desired Exclusive OR function defined in Equation 2.

Phototransistors 314-0 through 314-3 are connected in shunt with LEDs 316-0 through 316-3, respectively. In turn, LEDs 316-0 through 316-3 are connected in series with each other and with current limiting resistor 317 between a source of potential and a reference potential, in this example, positive and negative sources of potential. This series arrangement of LEDs 316 is more efficient as compared to utilizing individual driver units for energizing the individual LEDs. Higher efficiency results because the same current flow is used to energize all the LEDs and only one limiting resistor need be used. Phototransistors 314-0 through 314-3 respond to light emitted from LEDs 305-0 through 305-3 to control energization of LEDs 316-0 through 316-3 to yield visual indications of the logical states of the corresponding binary bits $B_0$ through $B_3$, respectively. Specifically, when ones of LEDs 305 are conducting and emitting light the corresponding binary bit is a logical 0 and the associated ones of phototransistors 314 are turned ON effectively shunting corresponding ones of LEDs 316 inhibiting them from emitting light, thereby yielding a visual indication that the corresponding binary bits are logical 0s. When LEDs 305 are not conducting associated ones of phototransistors 314 are OFF and corresponding ones of LEDs 316 emit light, thereby yielding a visual indication that the corresponding binary bits are logical 1s. If no visual indication of the states of the binary bits is required or desired optical couplers 315-0 through 315-3, LEDs 316-0 through 316-3, and resistor 317 may be eliminated from the circuit as shown in FIG. 3.

In operation, the embodiment shown in FIG. 3 effects the translation from Gray to binary code defined by Equations 1 and 2. In this example, binary logical 1s are defined as no current flowing through LEDs 304 and also LEDs 305 if utilized. Additionally, the outputs from amplifiers 302 are zero volts when the corresponding Gray code input $G_0$ (not $\overline{G}_0$) through $G_3$ are logical 1s, and +12 volts when $G_0$ through $G_3$ are logical 0s. Note that $\overline{G}_0$ is supplied to input 301-0 of amplifier 302-0. If it is desired to supply $G_0$ to input 301-0 resistor 306-0 should be connected to ground potential instead of to the +12 volt source and the polarity of LEDs 304-0 and 305-0 should be reversed.

The most significant stage of the translator shown in FIG. 3 operates to effect the translation defined in Equation 1, namely $B_0 = G_0$. Thus, when $G_0 = 1$, $\overline{G}_0 = 0$ and the output from amplifier 302-0 is +12 volts. Therefore, no current flows through LEDs 304-0 and 305-0, and phototransistors 307-0 and 314-0 are OFF. Consequently, no carry potential is supplied to the next less significant stage and a potential developed at output terminal 311-0 is 0 volts indicating that $B_0 = 1$. Additionally, LED 316-0 conducts emitting light thereby yielding a visual indication that $B_0 = 1$. When $G_0 = $, $\overline{G}_0 = 1$ and the output from amplifier 302-0 is 0 volts causing current to flow in a direction from the +12 volt source through LEDs 305-0 and 304-0 causing them to emit light which turns phototransistors 307-0 and 314-0 ON. Consequently, a negative carry potential is supplied via phototransistor 307-0 and diode 309-0 to output terminal 311-0 and via resistor 310-0 to the next less significant stage of the translator. The negative potential at terminal 311-0 indicates that $B_0 = 0$. Additionally, LED 316-0 is effectively shunted by phototransistor 314-0 inhibiting conduction thereby yielding a visual indication that $B_0 = 0$.

Each of the less significant stages, namely those associated with Gray code bits $G_1$ through $G_3$, operate in substantially the same manner except that phototransistor 307-3 of the least significant stage is not connected to supply a carry potential to a next less significant stage. Each of the lesser significant stages effects the function defined in Equation 2, namely $B_N = G_N \oplus B_{N-1}$.

Let us now consider the operation of the translator stage associated with Gray code bit $G_1$. Assuming that $B_{N-1} = 1$, i.e., $B_0 = 1$ no current flows through LED 304-0 and phototransistor 307-0 is OFF and no carry potential is being supplied to the next less significant stage. Since the output from amplifier 302-1 is zero volts when $G_1 = 1$, and +12 volts when $G_1 = 0$, it is seen that when $G_1 = 1$ current flows from the +12 volt source through appropriate ones of LEDs 305-1 and 304-1 causing them to emit light thereby turning phototransistors 314-1 and 307-1, respectively, ON, indicating that $B_1 = 0$. Since phototransistor 314-1 is ON, LED 316-1 is OFF thereby yielding a visual indication that $B_1 = 0$. Additionally, phototransistor 307-1 supplies the −12 volt carry potential to the next less significant stage. When $G_1 = 0$ the output of amplifier 302-1 is +12 volts and no current flows through LEDs 304-1 or 305-1 and phototransistors 307-1 and 314-1 are turned OFF thereby indicating that $B_1 = 1$. Since phototransistor 314-1 is OFF, LED 316-1 is ON thereby yielding a visual indication that $B_1 = 1$ and since phototransistor 307-1 is OFF no carry potential is supplied to the next less significant stage. Therefore, it is readily seen from Equation 2 that for $B_{N-1} = 1$, $B_N = \overline{G}_N$.

Now assuming that $B_{N-1} = 0$, i.e., $B_0 = 0$, it is seen that current flows through LED 304-0 causing it to emit light and phototransistor 307-0 is turned ON. Consequently, a negative carry potential is supplied to the junction between resistor 306-1 and LEDs 305-1. Again, since the output of amplifier 302-1 is +12 volts when $G_1 = 0$, and 0 volts when $G_1 = 1$, it is seen that when $G_1 = 0$ current flows through appropriate ones of LEDs 304-1 and 305-1 in a direction from amplifier 302-1 to the junction between LED 305-1 and resistor 306-1 causing phototransistors 307-1 and 314-1 to be turned ON thereby indicating that $B_1 = 0$. Since phototransistor 307-1 is ON the −12 volt carry potential is supplied to the next less significant stage. Additionally, phototransistor 314-1 shunts current around LED 316-1 causing it to be OFF thereby yielding a visual indication that $B_1 = 0$. When $G_1 = 1$ no current flows through LEDs 304-1 and 305-1 and, hence, phototransistors 307-1 and 314-1 are OFF indicating that $B_1 = 1$. Since phototransistor 307-1 is OFF no carry potential is supplied to the next less significant stage and since phototransistor 314-1 is OFF, LED 316-1 conducts emitting light thereby yielding visual indication that $B_1 = 1$. Therefore, it is seen from Equation 2 that for $B_{N-1} = 0$, $B_N = G_N$. It should be noted that in this example a threshold potential of approximately 2 volts is required to cause the LEDs to "fire," i.e., emit light. Thus, approximately a 4-volt potential differential is required between the output of amplifier 302-1 and the junction of resistors 306-1 and 310-0 in order to energize LEDs 304-1 and 305-1 for emitting light. This required voltage differential, therefore, insures against erroneous outputs by requiring a "hard" ON condition before the LEDs will emit light.

Consider an example in which the Gray code bits $G_0$ through $G_3 = 1011$. Then, amplifiers 302-0 and 302-1 yield +12 volt outputs while amplifiers 302-2 and 302-3 yield 0 volt outputs. Thus, LEDs 304-0 and 305-0 do not conduct and, hence, phototransistors 307-0 and 314-0 are OFF causing a 0 volt output at terminal 311-0 and also causing LED 316-0 to emit light thereby indicating that $B_0 = 1$. Since $B_0 = 1$, no negative carry potential is supplied to the next less significant stage and since the output from amplifier 302-1 is +12 volts no current flows through LEDs 304-1 and 305-1 causing phototransistors 307-1 and 314-1 to be OFF. Consequently, a 0 volt output is developed at terminal 311-1 and LED 316-1 emits light both indicating $B_1 = 1$. Again, no carry potential is supplied to the next less significant stage and since the output from amplifier 302-2 is zero volts LEDs 305-2 and 304-2 conduct current. Therefore, phototransitors 307-2 and 314-2 are ON and a negative potential is supplied to output terminal 311-2 indicating that $B_2 = 0$. Additionally, phototransistor 314-2 shunts LED 316-2 inhibiting conduction thereby yielding a visual indication that $B_2 = 0$. Since $B_2 = 0$, a negative carry potential is supplied to the next less significant stage and since the output from amplifier 302-3 is zero volts no current flows through LEDs 304-3 and 305-3 causing phototransistors 307-3 and 314-3 to be OFF. Thus a zero volt output is developed at terminal 311-3 indicating that $B_3 = 1$. Since phototransistor 314-3 is OFF, LED 316-3 conducts emitting light yielding a visual indication that $B_3 = 1$. Therefore, both electrical and visual indications are obtained of the desired binary output, namely bits $B_0$, $B_1$, $B_2$, $B_3 = 1101$.

Figure 4:
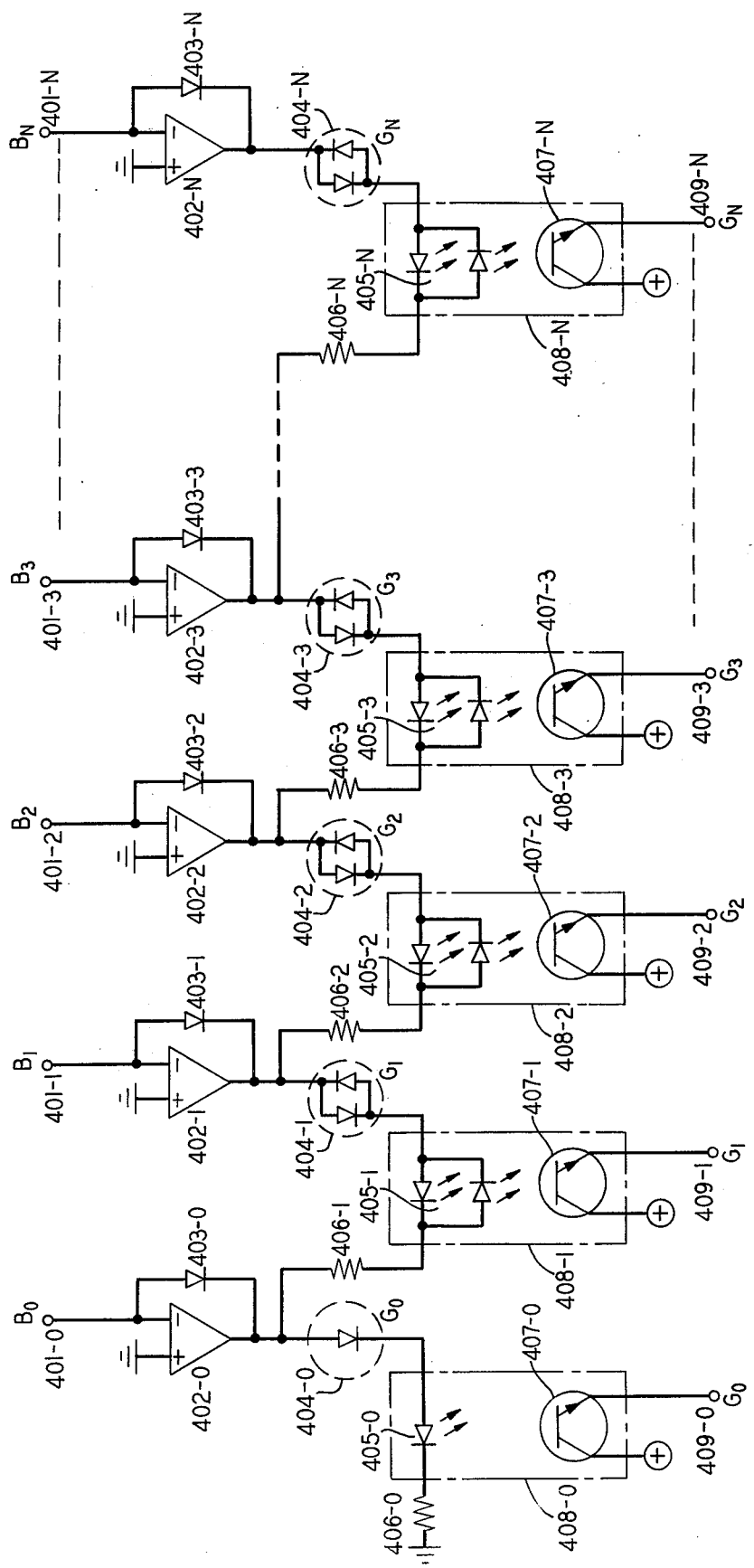
FIG. 4 shows a translator for converting signals from conventional binary code to Gray code.

FIG. 4 shows details of an embodiment for translating signals representative of a number of conventional binary code to signals representative of the number in Gray code. To this end, the circuit of FIG. 4 effects the functions defined in Equations 3 and 4. Accordingly, signals representative of information bits in binary code ordered in sequence from a most significant bit to a least significant bit, namely $B_0$ through $B_N$ are simultaneously supplied to input terminals 401-0 through 401-N of buffer amplifiers 402-0 through 402-N, respectively, for an interval of sufficient duration to effect the desired translation. Here again the response times of the devices employed to implement the translator will determine the time interval. Amplifiers 402 are also of the high gain differential type commonly known as operational amplifiers of a type now well known in the art. Diodes 403-0 through 403-N are connected between an inverting input and output of amplifiers 402-0 through 402-N, respectively, and are operative to limit the outputs from amplifiers 403 to 0 volts or +12 volts. It is noted that the output impedance of amplifiers 403 is substantially 0 ohms at 0 volts. Outputs of amplifiers 403-0 through 403-N are connected on a one-to-one basis to the serial arrangement of LED 404-0, LED 405-0 and resistor 406-0 through the serial arrangement of LEDs 404-N, LEDs 405-N and resistors 406-N, respectively. Resistor 406-0 is connected to a reference potential, in this example ground potential, while resistors 406-1 through 406-N are connected in circuit with the output of the next more significant amplifier, namely amplifiers 402-0 through 402-(N−1), respectively. Each of LEDs 404-1 through 404-N and 405-1 through 405-N includes first and second LEDs connected in parallel and oppositely poled for responding to bidirectional current flow between adjacent ones of the outputs of amplifiers 402 for emitting light. Phototransistors 407-0 through 407-N are associated with and in predetermined spatial relationship with LEDs 405-0 through 405-N thereby forming optical couplers 408-0 through 408-N, respectively. Phototransistors 407-0 through 407-N are each connected to a source of potential, for example +12 volts, and are connected on a one-to-one basis to output terminals 409-0 through 409-N, respectively. Phototransistors 407 are responsive to light emitted from associated ones of LEDs 405 for yielding output signals representative of the desired Gray code bits $G_0$ through $G_N$ at output terminals 409-0 through 409-N, respectively.

LEDs 404-0 through 404-N are employed to yield visual indications of the logical states of the desired Gray code bits $G_0$ through $G_N$, respectively. If a visual indication is not required or desired LEDs 404 may be eliminated from the circuit of FIG. 4.

Amplifier 402-0 in conjunction with LED 404-0 (if used), LED 405-0 and resistor 406-0 operates to effect the translation defined in Equation 3, namely $G_0 = B_0$. When $B_0 = 1$ the output from aplifier 402-0 is, in this example, +12 volts causing current to flow through LEDs 404-0 and 405-0 which, in turn, emit light indicating that $G_0 = 1$. Additionally, the light emitted from LED 405-0 turns phototransistor 407-0 ON which, in turn, supplies, in this example, +12 volts to output terminal 409-0 also indicating that $G_0 = 1$. When $B_0 = 0$ the output from amplifier 402-0 is 0 volts and no current flows through LEDs 404-0 and 405-0. Consequently, LEDs 404-0 and 405-0 do not emit light thereby indicating that $G_0 = 0$. Additionally, phototransistor 407-0 is OFF and zero potenntial is developed at output terminal 409-0 also indicating that $G_0 = 0$.

The binary carry function $B_{N-1}$ of Equation 4 is realized by connecting the serial arrangement of LEDs and limiting resistors associated with the output of each of the amplifiers associated with the less significant binary bit inputs in circuit with the output of the amplifier associated with the next more significant binary bit input of the translator. Since each of the less significant stages of the translator operate in substantially identical fashion to effect the function defined in Equation 4, only the operation of the translator stage associated with binary input $B_1$ will be discussed in detail. Thus, in this example, $B_N = B_1$ and $B_{N-1} = B_0$. Therefore, it is seen from Equation 4 that when $B_0 = 0$, $G_1 = B_1$ and when $B_0 = 1$, $G_1 = \bar{B}_1$. Referring now to FIG. 4, it is seen that when $B_0 = 0$ the output of amplifier 402-0 is 0 volts and that when $B_1 = 1$ the output of amplifier 402-1 is, in this example, +12 volts. Consequently, current flows in a direction from the output of amplifier 402-1 to the output of amplifier 402-0 causing appropriate ones of LEDs 404-1 and 405-1 to conduct and, therefore, emit light. The conducting one of LEDs 404-1 yields a visual indication that $G_1 = 1$ while the conducting one of LEDs 405-1 turns phototransistor 407-1 ON which, in turn, supplies a +12 volt potential to output terminal 409-1, also indicating that $G_1 = 1$. When $B_1 = 0$ and $B_0 = 0$, the outputs of amplifiers 402-1 and 402-0 are both 0 volts and no current flows. Consequently, LEDs 404-1 and 405-1 do not conduct thereby indicating that $G_1 = 0$. Since phototransistor 407-1 is OFF no potential is developed at output terminal 409-1 also indicating that $G_1 = 0$.

When $B_0 = 1$ the output of amplifier 402-0 is +12 volts. Then, when $B_1 = 1$ the output of amplifier 402-1 is also +12 volts. Consequently, no current flows between the respective outputs and LEDs 404-1 and 405-1 do not conduct thereby indicating that $G_1 = 0$. Here again phototransistor 407-1 is OFF and no potential is developed at terminal 409-1 also indicating that $G_1 = 0$. When $B_1 = 0$ the output of amplifier 402-1 is zero volts and current flows from the output of amplifier 402-0 to the output of amplifier 402-1 causing appropriate ones of LEDs 405-1 and 404-1 to conduct thereby emitting light. Again, the conducting one of LEDs 404-1 yields a visual indication that $G_1 = 1$ while the conducting one of LEDs 405-1 causes phototransistor 407-1 to turn ON which, in turn, supplies a +12 volt potential to output terminal 409-1, again indicating that $G_1 = 1$.

Consider an example of converting binary bits $B_0$ through $B_3 = 1100$ to the corresponding Gray code bits $G_0$ through $G_3$. Accordingly, signals representative of binary bits $B_0$ through $B_3$ are supplied to inputs 401-0 through 401-3, respectively, and the outputs of amplifiers 402-0 and 402-1 are +12 volts while the outputs from amplifiers 402-2 and 402-3 are zero volts. Since the output of aplifier 402-0 is +12 volts. LEDs 404-0 and 405-0 conduct indicating that $G_0 = 1$. LED 404-0 yields a visual indication of this condition, while LED 405-0 turns phototransistor 407-0 ON which, in turn, supplies a +12 volt potential to output terminal 409-0, again indicating that $G_0 = 1$. Since the outputs from amplifiers 402-0 and 402-1 are both +12 volts no current flows therebetween and LEDs 404-1 and 405-1 do not emit light thereby indicating that $G_1 = 0$. Since LED 405-1 does not conduct, phototransistor 407-1 is OFF and no potential is developed at output terminal 409-1, again indicating that $G_1 = 0$. Since the output from amplifier 402-1 is +12 volts and the ouput from amplifier 402-2 is 0 volts, current flows therebetween and appropriate ones of LEDs 404-2 and 405-2 conduct thereby emitting light indicating that $G_2 = 1$. The conducting one of LEDs 405-2 turns phototransistor 407-2 ON which, in turn, supplies a +12 volt potential to output terminal 409-2, again yielding an indication that $G_2 = 1$. Since the output of amplifiers 402-2 and 402-3 are both 0 volts, no current flows therebetween and, consequently, LEDs 404-3 and 405-3 do not conduct. Since LED 405-3 is not conducting, phototransistor 407-3 remains OFF and no potential is developed at output terminal 409-3, again indicating that $G_3 = 0$. Thus, the desired Gray code output bits $G_0$ through $G_3 = 1010$ are generated.

The above-described arrangements are, of course, merely illustrative of applications of the inventive principles disclosed. Numerous other arrangements may be devised by those skilled in the art without departing from the spirit or scope of those inventive principles. For example, the light emitting diodes employed to enable the phototransistors for effecting the carry function could possibly be employed to yield a visual indication of the desired binary bits.

What is claimed is:

1. Apparatus for converting information bits in a first binary code to information bits in a second binary code which comprises:
 a plurality of input means for supplying a corresponding plurality of signals representative of information bits in the first binary code ordered in a predetermined sequence from a most significant bit to a least significant bit;
 a first plurality of radiant energy emitting means associated with and connected on a one-to-one basis in predetermined circuit relationship with the individual ones of said plurality of input means in said sequence; and
 a first plurality of radiant energy responsive means associated on a one-to-one basis with at least said most significant through the next to least significant ones of said first plurality of radiant energy emitting means and being connected on a one-to-one basis in predetermined circuit relationship with the next less significant one in said sequence of said first plurality of radiant energy emitting means, the individual ones of said first plurality of radiant energy responsive means being responsive to radiant energy emitted from said associated radiant energy emitting means for controllably supplying a potential to said next less significant radiant energy emitting means, wherein a potential developed by said most significant imput means determines the conductive state of the most significant one of said first plurality of radiant energy emitting means and wherein the conductive state of the individual remaining ones of said first plurality of radiant energy emitting means in said sequence is determined cooperatively by the potential supplied by said radiant energy responsive means connected in circuit relationship therewith and the potential developed by said associated input means, said conductive states of said first plurality of radiant energy emitting means being indicative of information bits in the second binary code.

2. Apparatus as defined in claim 1 further including a second plurality of radiant energy emitting means connected on a one-to-one basis in series with the individual ones of said first plurality of radiant energy emitting means in said sequence, a third plurality of radiant energy emitting means connected in series circuit relationship between a source of potential and a reference potential, the individual ones of said third plurality of radiant energy emitting means corresponding to an information bit in the second binary code, and a second plurality of radiant energy responsive means associated on a one-to-one basis with the individual ones of said second plurality of radiant energy emitting means and connected on a one-to-one basis in parallel with the individual ones of said third plurality of radiant energy emitting means, the individual ones of said second plurality of radiant energy responsive means being responsive to radiant energy emitted from the associated ones of said second plurality of radiant energy emitting means to controllably shunt current flow around corresponding ones of the third plurality of radiant energy emitting means, wherein the conductive states of the individual ones of said third plurality of radiant energy emitting means are indicative of the logical states of information bits in the second binary code.

3. Apparatus as defined in claim 2 wherein at least the next to most significant through the least significant ones of said first and second pluralities of radiant energy emitting means include first and second light emitting diodes connected in parallel and oppositely poled, said most significant radiant energy emitting means of said first and second pluralities each include a light emitting diode, each of said first and second pluralities of radiant energy responsive means includes a phototransistor and each of said third plurality of radiant energy emitting means includes a light emitting diode.

4. Apparatus as defined in claim 1 further including a second plurality of radiant energy emitting means connected on a one-to-one basis in series with the individual ones of said first plurality of radiant energy emitting means in said sequence and arranged to yield a visual indication of information bits in the second binary code.

5. Apparatus as defined in claim 4 wherein each of at least the next to most significant through the least significant ones of said second plurality of radiant energy emitting means include means responsive to bidirectional current flow for emitting radiant energy.

6. Apparatus as defined in claim 1 wherein each of at least the next to most significant through the least significant ones of said first plurality of radiant energy emitting means includes means responsive to bidirectional current flow for emitting radiant energy.

7. Apparatus as defined in claim 6 wherein the radiant energy emitting means associated with the most significant input means includes a light emitting diode and wherein the remaining ones of said radiant energy emitting means each includes first and second light emitting diodes connected in parallel and oppositely poled.

8. Apparatus as defined in claim 7 wherein each of said radiant energy emitting means further includes first resistor means serially connected with said light emitting diodes, said serial connections being connected in circuit between said associated input means and a reference potential point.

9. Apparatus as defined in claim 8 wherein each of said radiant energy responsive means includes a phototransistor and second resistor means, said phototransistor and second resistor means being serially connected between a source of potential and a circuit point between the light emitting diodes and said first resistor means associated with the next less significant input means, said first and second resistor means being arranged to develop a desired potential at the circuit junction therebetween when said phototransistor is ON.

10. Apparatus as defined in claim 9 wherein said first plurality of radiant energy responsive means further includes a phototransistor associated with and responsive to radiant energy emitted from the least significant one of said first plurality of radiant energy emitting means and further including a plurality of output terminals, wherein said phototransistors are connected on a one-to-one basis with a corresponding one of said plurality of output terminals for controllably supplying potentials to said output terminals representative of logical states of information bits in the second binary code.

11. Apparatus as defined in claim 10 wherein each of said input means includes amplifier means for generating said potentials representative of the logical states of the bits in the first binary code and wherein said light emitting diodes of said first plurality of radiant energy emitting means and said phototransistors of said first plurality of radiant energy responsive means are arranged on a one-to-one basis in predetermined spatial relationship to form a plurality of optical couplers.

* * * * *